United States Patent
Tang et al.

(10) Patent No.: US 10,178,812 B2
(45) Date of Patent: Jan. 8, 2019

(54) HEAT DISSIPATION DEVICE AND UAV USING THE SAME

(71) Applicant: SZ DJI TECHNOLOGY CO., LTD., Shenzhen (CN)

(72) Inventors: Yin Tang, Shenzhen (CN); Xifeng Zhao, Shenzhen (CN); Tao Zhao, Shenzhen (CN); Xiaokai Guo, Shenzhen (CN); Yanxin Huang, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 12 days.

(21) Appl. No.: 15/448,782

(22) Filed: Mar. 3, 2017

(65) Prior Publication Data

US 2017/0181330 A1 Jun. 22, 2017

Related U.S. Application Data

(63) Continuation of application No. PCT/CN2014/086628, filed on Sep. 16, 2014.

(51) Int. Cl.
*H05K 7/20* (2006.01)
*B64C 39/02* (2006.01)

(52) U.S. Cl.
CPC ....... *H05K 7/20863* (2013.01); *B64C 39/024* (2013.01); *H05K 7/20145* (2013.01); *H05K 7/20854* (2013.01); *B64C 2201/108* (2013.01)

(58) Field of Classification Search
None
See application file for complete search history.

(56) References Cited

U.S. PATENT DOCUMENTS

| | | | | |
|---|---|---|---|---|
| 6,320,776 B1 * | 11/2001 | Kajiura | ................. | H02M 7/003 361/709 |
| 6,359,779 B1 * | 3/2002 | Frank, Jr. | ................. | G06F 1/18 361/679.33 |
| 6,665,183 B1 * | 12/2003 | Shikata | ............. | H05K 7/20918 257/721 |
| 7,027,300 B2 * | 4/2006 | Lord | .................... | H01L 23/467 165/80.3 |
| 7,164,586 B2 | 1/2007 | Lin | | |

(Continued)

FOREIGN PATENT DOCUMENTS

| CN | 101312635 A | 11/2008 |
|---|---|---|
| CN | 101331816 A | 12/2008 |
| CN | 102316700 A | 1/2012 |
| CN | 202310424 U | 7/2012 |
| CN | 202488375 U | 10/2012 |

(Continued)

OTHER PUBLICATIONS

The World Intellectual Property Organization (WIPO) International Search Report for PCT/CN2014/086628 dated Jun. 18, 2015 8 Pages.

*Primary Examiner* — Courtney Smith
(74) *Attorney, Agent, or Firm* — Anova Law Group, PLLC

(57) ABSTRACT

A heat dissipation device includes an air guiding cover and a heat conduction plate. The air guiding cover includes an air duct configured to guide an airflow and including a mounting window formed on a sidewall of the air duct, an air inlet formed at a first end of the air duct, and an air outlet formed at a second end of the air duct. The heat conduction plate is disposed at the mounting window and covers the mounting window.

19 Claims, 4 Drawing Sheets

(56) References Cited

U.S. PATENT DOCUMENTS

| | | | |
|---|---|---|---|
| 7,265,981 B2* | 9/2007 | Lee | H05K 7/20445 165/185 |
| 8,363,408 B2* | 1/2013 | Zheng | H01L 23/467 165/80.3 |
| 8,379,384 B2* | 2/2013 | Smalen | H05K 7/20909 165/104.33 |
| 8,687,357 B2* | 4/2014 | Nagano | H02M 7/08 165/104.33 |
| 9,622,390 B2* | 4/2017 | Hwang | H05K 7/20009 |
| 9,648,779 B2* | 5/2017 | Kohn | G06F 1/181 |
| 2002/0064028 A1* | 5/2002 | Nielsen | H05K 7/20918 361/703 |
| 2005/0124221 A1 | 6/2005 | Lin | |
| 2012/0160463 A1 | 6/2012 | Lai | |
| 2012/0262968 A1* | 10/2012 | Nagano | H02M 7/003 363/141 |

FOREIGN PATENT DOCUMENTS

| | | |
|---|---|---|
| CN | 203377773 U | 1/2014 |
| CN | 204217293 U | 3/2015 |
| EP | 0771138 A | 5/1997 |
| JP | S55020272 U | 7/1978 |
| JP | H02127093 U | 10/1990 |
| JP | H0448762 A | 2/1992 |
| JP | H04056155 A | 2/1992 |
| JP | H08125366 A | 5/1996 |
| JP | H08140349 A | 5/1996 |
| JP | 2003502749 A | 1/2003 |
| JP | 2008103576 A | 5/2008 |
| JP | 2009231511 A | 10/2009 |
| JP | 2010023825 A | 2/2010 |
| JP | 2012170183 A | 9/2012 |
| JP | 2013074022 A | 4/2013 |
| JP | 2013531573 A | 8/2013 |
| TW | 201236554 A1 | 9/2012 |
| WO | 2013060519 A1 | 5/2013 |

* cited by examiner

HEAT DISSIPATION DEVICE AND UAV USING THE SAME

CROSS-REFERENCE TO RELATED APPLICATION

This is a continuation application of International Application No. PCT/CN2014/086628, filed on Sep. 16, 2014, the entire contents of which are incorporated herein by reference.

TECHNICAL FIELD

The present disclosure relates to a heat dissipation device and, in particular, to a heat dissipation device having an air channel tube and an unmanned aerial vehicle (UAV) using the same.

BACKGROUND

For an unmanned aerial vehicle (UAV), such as a multi-rotor all-in-one vehicle, a main control system is generally required to have a compact structure in order to reduce the mass and volume of the all-in-one vehicle as much as possible. The main control system can comprise an inertial measurement unit (IMU) module and an orthogonal frequency-division multiplexing (OFDM) module. Various modules (for example, the IMU module and the OFDM module) of the main control system are deployed in an integral space as far as possible.

However, the modules of the main control system normally may generate heat when operating. In such a closed space of the UAV, if the heat is not dissipated timely, it may cause an environment temperature of the main control system to increase. Moreover, each of the modules of the main control system may have a respective requirement for the environment temperature in order to operate normally, an electronic module generating more heat may impact an electronic module generating less heat. For example, the amount of heat generated by the IMU module is usually lower than that generated by the OFDM module. Therefore, for the above-described reasons, the main control system may not to be able to operate in a good operating state or to operate normally.

SUMMARY

In view of the above, the present disclosure provides a heat dissipation device which is capable of reducing an overall temperature of a main control system of an unmanned aerial vehicle (UAV) and avoiding the heat generated by a module of the main control system from influencing another module of the main control system.

In accordance with the present disclosure, there is provided a heat dissipation device including an air guiding cover and a heat conduction plate. The air guiding cover includes an air duct configured to guide an airflow and including a mounting window formed on a sidewall of the air duct, an air inlet formed at a first end of the air duct, and an air outlet formed at a second end of the air duct. The heat conduction plate is disposed at the mounting window and covers the mounting window.

In some embodiments, the air inlet and the air outlet are disposed opposite to each other.

In some embodiments, an opening size of the air inlet is greater than an opening size of the air outlet.

In some embodiments, the sidewall includes a plane-shaped mounting sidewall on which the mounting window is formed, and the heat conduction plate includes a plane-shaped plate body covering the mounting window.

In some embodiments, the mounting window extends from the first end of the air duct to the second end of the air duct, and extends all the way through the air outlet. The plate body extends to the air outlet and forms the air outlet jointly with other sidewalls of the air duct.

In some embodiments, the heat dissipation device further includes a midstream guiding face formed at a middle section of another sidewall of the air duct and configured to converge the airflow towards the air outlet. The other sidewall is opposite to the sidewall on which the mounting window is formed.

In some embodiments, the midstream guiding face includes a convex curved face or an inclined plane.

In some embodiments, the heat dissipation device further includes an upstream guiding face formed on another sidewall of the air duct at a location close to the air inlet and configured to converge an airflow from the air inlet towards a middle section of the air duct. The other sidewall is opposite to the sidewall on which the mounting window is formed.

In some embodiments, the upstream guiding face includes a convex curved face or an inclined plane.

In some embodiments, the heat conduction plate comprises a plate body sealing the mounting window and a plurality of heat dissipation fins disposed on a surface of the plate body that faces the air duct.

In some embodiments, a hollow region is formed among the plurality of heat dissipation fins.

In some embodiments, the plurality of heat dissipation fins are disposed substantially in parallel and spaced apart from each other to form a plurality of flow guiding grooves which are disposed along an extending direction parallel to the air duct.

In some embodiments, the heat dissipation device further includes a plurality of fixing bosses provided on a surface of the plate body that faces the air duct and fixedly connected with at least one of other sidewalls of the air duct to fix the heat conduction plate on the air guiding cover. One or more of the fixing bosses are fixedly connected with a corresponding one of the heat dissipation fins.

In some embodiments, the at least one of other sidewalls of the air duct protrude outwardly to form a plurality of positioning slots. The plurality of fixing bosses respectively match the plurality of positioning slots.

In some embodiments, the heat conduction plate is detachably connected with the air guiding cover.

In some embodiments, the heat conduction plate is fixedly connected with the air guiding cover via a snap structure.

In some embodiments, the heat conduction plate is fixedly connected with the air guiding cover via a threaded fastener.

In some embodiments, the heat conduction plate includes a mounting portion for fixing an electronic module and provided on a surface of the heat conduction plate that faces away from the air duct.

In some embodiments, the air guiding cover further includes a flow guiding plate disposed within the air duct. A flow guiding face of the flow guiding plate is disposed aslope relative to an extending direction of the air duct to form a flow converging portion with a gradually narrowing width at a middle section of the air duct. An end of the flow converging portion with a larger width is disposed towards the air inlet.

In some embodiments, the flow guiding plate includes a main plate body and a connecting plate disposed at a back side of the main plate body. The connecting plate is fixedly connected with another sidewall of the air duct to fix the flow guiding plate within the air duct. The flow guiding face includes a front side of the main plate body.

In some embodiments, the flow guiding plate includes a main plate body and a hook located on an edge of the main plate body. The flow guiding face includes a front side of the main plate body. The air duct includes a snap structure on another sidewall of the air duct. The hook is snapped with the snap groove to fix the main plate body within the air duct.

In some embodiments, the flow guiding face includes a concave arc face, a convex arc face, or a plane.

In some embodiments, the flow guiding face is disposed in a direction perpendicular to the sidewall of the air duct.

In some embodiments, the flow guiding face is disposed opposite to the sidewall of the air duct.

In some embodiments, the heat dissipation device further includes a mounting support located within the air duct and configured to mount an electronic module within the air duct.

In some embodiments, the mounting support is fixedly connected with a surface of the heat conduction plate that faces the air duct.

In some embodiments, the mounting support includes a thermal insulation support and is detachably connected with the heat conduction plate.

In some embodiments, the mounting support includes a U-shaped plate body including a hollow portion for heat dissipation and fixing lugs formed at two ends of the U-shaped plate body. A clamping space is formed within the U-shaped plate body. The fixing lugs bend from the two ends of the U-shaped plate body and extend in opposite directions. The fixing lugs are fixedly connected with the surface of the heat conduction plate that faces the air duct.

In some embodiments, the mounting support includes a plurality of L-shaped frames. One end of each of the L-shaped frames is fixed on the surface of the heat conduction plate that faces the air duct. Another end of each of the L-shaped frames is disposed in parallel to and spaced apart from the heat conduction plate. A clamping space is formed between two of the L-shaped frames that are disposed opposite to each other.

In some embodiments, the mounting support is fixedly connected with the sidewall of the air duct.

In some embodiments, the heat dissipation device further includes a fan configured to blow the airflow into the air duct via the air inlet.

In some embodiments, the fan is mounted at the air inlet, and a wind-out face of the fan is disposed towards the air duct such that the fan is directly in communication with the air inlet.

In some embodiments, the air inlet includes a plurality of positioning posts arranged at an opening end face of the air inlet. The fan includes a plurality of positioning holes arranged at an edge of the fan and corresponding to the positioning posts. The plurality of positioning posts pass through the plurality of locating holes, respectively, to position the fan on the opening end face of the air inlet.

In some embodiments, the heat dissipation device further includes a fan support via which the fan is fixed on an opening end face of the air inlet.

In some embodiments, the heat dissipation device further includes a flow guiding channel connecting the fan with the air inlet.

In some embodiments, the heat dissipation device further includes a mounting housing disposed at a side of the heat conduction plate that faces away from the air duct. The mounting housing and the heat conduction plate jointly form an electrical box.

In some embodiments, the mounting housing includes a bottom plate disposed opposite to the heat conduction plate and a plurality of side plates connected with edges of the bottom plate and connected to each other in sequence to enclose an loop-like closed structure. Edges of the plurality of side plates that are distal from the bottom plate form an opening having a shape matching a shape of an outline of the heat conduction plate.

In some embodiments, the bottom plate includes at least one of a connecting window configured to receive an external plug or a heat dissipation window configured to expose an electronic component arranged in the electrical box.

In some embodiments, the heat dissipation device further includes a connecting support fixedly connecting the heat conduction plate and the mounting housing.

In some embodiments, the connecting support includes a Z-shaped structure and includes a connecting body and two fixing portions disposed at two ends of the connecting body, respectively, and fixedly connected with the heat conduction plate and the mounting housing, respectively.

In some embodiments, the mounting housing includes a snap hole at one of the side plates. The connecting body includes a sheet-shaped structure. The two fixing portions include folded sheets bending and extending from the two ends of the connecting body. One of the two fixing portions is inserted in the snap hole, and the other one of the two fixing portions is disposed clingingly at a surface of heat conduction plate that faces the air duct.

In some embodiments, the heat dissipation device further includes at least one fixing support configured to fix the air guiding cover.

In some embodiments, the at least one fixing support includes a first fixing support fixedly connected with the air guiding cover and a second fixing support fixedly connected with the heat conduction plate.

In some embodiments, the at least one fixing support includes a U-shaped body and two connecting lugs. The U-shaped body includes a bottom and two arm extending from two ends of the bottom, respectively, towards a same side of the bottom. The two connecting lugs are disposed spaced apart from and opposite to each other, and extend in a direction perpendicular to the bottom and facing away from the arms of the U-shaped body.

Also in accordance with the present disclosure, there is provided an unmanned aerial vehicle (UAV) including any of the heat dissipation device described above, a first electronic module arranged in the heat dissipation device, and a second electronic module arranged in the heat dissipation device and separated from the heat dissipation device.

In some embodiments, the first electronic module generates more heat than the second electronic module when the UAV operates.

In some embodiments, the first electronic module generates less heat than the second electronic module when the UAV operates.

In some embodiments, the UAV further includes a third electronic module disposed at a side of the second electronic module that faces away from the heat conduction plate.

In some embodiments, the first electronic module includes an inertial measurement unit module, the second electronic module includes an orthogonal frequency-division multiplexing module, and the third electronic module includes a control module. The first, second, and third electronic modules form a main control module of the UAV.

In some embodiments, the first electronic module includes an inertial measurement unit module and the second electronic module includes an orthogonal frequency-division multiplexing module.

A heat dissipation device according to the present disclosure has at least the following advantages:

(1) The heat dissipation device according to the present disclosure dissipates the heat generated by a plurality of electronic modules separately, thereby preventing the heat generated by one electronic module from influencing another electronic module, such that the plurality of electronic modules can operate in different environmental temperatures. Further, the heat generated by various electronic modules can be taken away quickly via the airflow circulating within the air duct of the air guiding cover.

For example, an IMU module is disposed within the air duct of the air guiding cover. The heat generated by the IMU module can be taken away directly by the airflow within the air duct of the air guiding cover. An OFDM module is located outside the air guiding cover and fixed on the heat conduction plate. The heat generated by the OFDM module is conducted to the heat conduction plate and taken away by the airflow within the air duct of the air guiding cover.

(2) The heat conduction plate of the heat dissipation device according to the present disclosure directly constitutes a portion of the sidewalls of the air duct of the air guiding cover, such that the heat generated by an electronic module can be dissipated directly via the heat conduction plate, thereby improving the heat dissipation efficiency for the electronic module.

(3) The electronic module is fixed directly on the beat conduction plate, which is fixed on the air guiding cover. This allows the electronic module to be more firmly fixed in the UAV, thus avoiding bad electrical contact in the electronic module when the UAV flies and vibrates. Further, the strength of the whole structure of the UAV is enhanced, meeting the requirement of the strength on the structure of the UAV.

As compared to a traditional UAV, a UAV according to the present disclosure has at least the following advantages:

(1) The UAV according to the present disclosure employs a heat dissipation device to dissipate the heat generated by a plurality of electronic modules separately, thereby preventing the heat generated by one electronic module from influencing another electronic module, such that the plurality of electronic modules can operate in different environmental temperatures. Further, the heat generated by various electronic modules can be taken away quickly via the airflow circulating within the air duct of the air guiding cover.

For example, an IMU module is disposed within the air duct of the air guiding cover. The heat generated by the IMU module can be taken away directly by the airflow within the air duct of the air guiding cover. An OFDM module is located outside the air guiding cover and fixed on the heat conduction plate. The heat generated by the OFDM module is conducted to the heat conduction plate and taken away by the airflow within the air duct of the air guiding cover.

(2) The heat conduction plate of the above-described heat dissipation device directly constitutes a portion of the sidewalls of the air duct of the air guiding cover, such that the heat generated by the second electronic module can be dissipated directly via the heat conduction plate, thereby improving the heat dissipation efficiency for the second electronic module.

(3) The second electronic module of the above described UAV is fixed directly on the heat conduction plate, which is fixed on the air guiding cover. This allows the second electronic module to be more firmly fixed in the UAV, thus avoiding that bad electrical contact in the second electronic module when the UAV flies and vibrates. Further, the strength of the whole structure of the UAV is enhanced, meeting the requirement of the strength on the structure of the UAV.

DETAILED DESCRIPTION OF THE EMBODIMENTS

Figure 1:
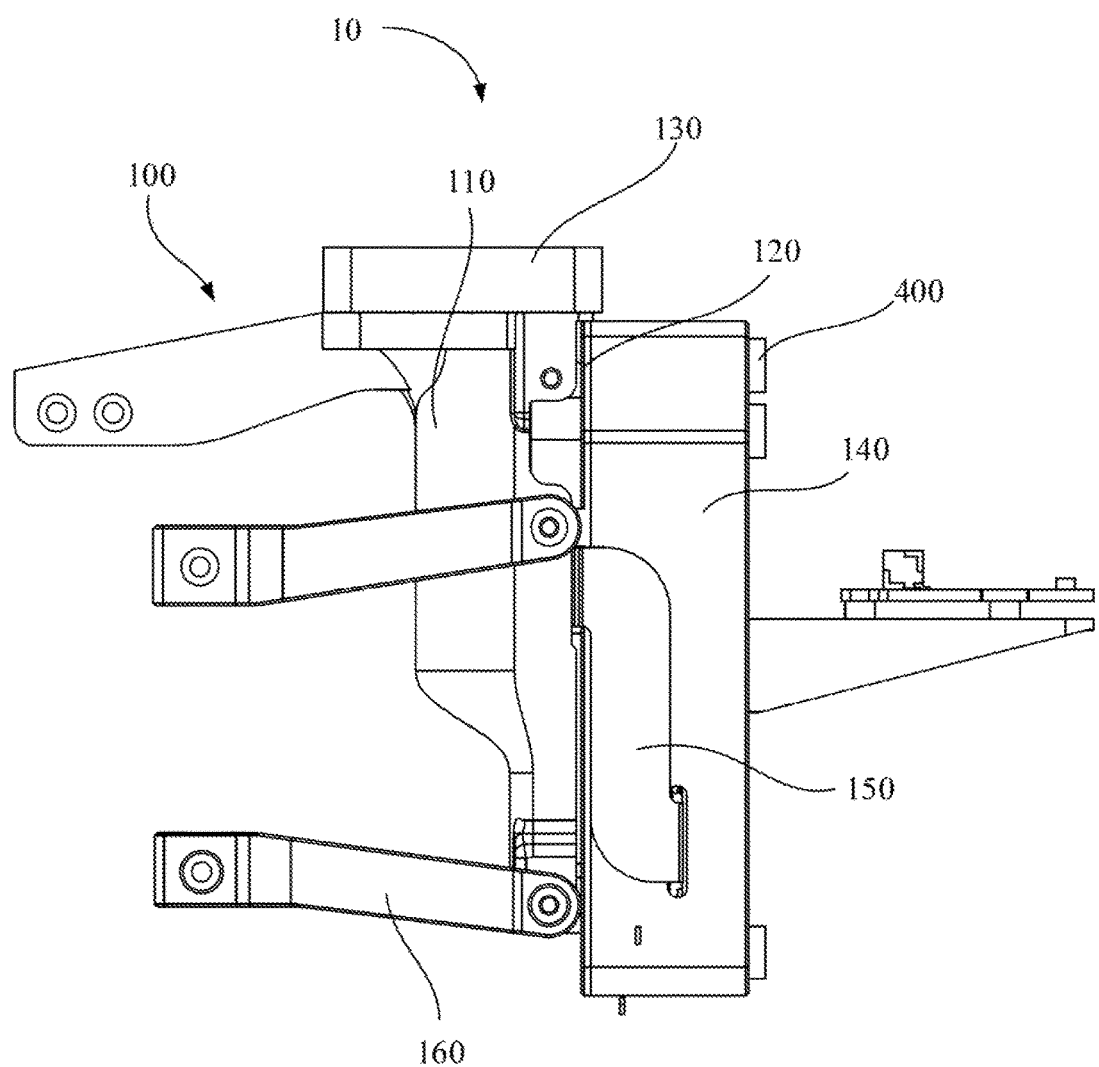
FIG. 1 is a structural diagram showing a UAV according to an embodiment of the present disclosure.

Exemplary embodiments of the present disclosure will be described in more detail below in combination with the drawings. It should be apparent that the exemplary embodiments described herein are only a part rather than all of the embodiments of the present disclosure. All other embodiments obtained by those having ordinary skills in the art on the basis of the exemplary embodiments described herein without any inventive efforts should fall within the scope of the present disclosure.

It should be noted that, when a component is referred as "being fixed to" another component, the component may be directly on, e.g., contacting, the other component, or there may be an intermediate component therebetween. When a component is referred as "connecting with/to" another component, the component may be directly connected to, e.g., contacting, the other component or there may be an intermediate component therebetween. Terms such as "perpendicular," "horizontal," "left," "right," and the like as used herein are merely for illustrative purposes.

Unless defined otherwise, all technical and scientific terms used herein have the same meanings as those skilled in the art generally understand. The terms used in the present disclosure are merely for the purpose of describing specific embodiments, and not intended to limit the present disclosure. The term "and/or" used herein may comprise any or all of the combinations of one or more related items listed.

Consistent with embodiments of the present disclosure, there is provided a heat dissipation device that may be applied in a unmanned aerial vehicle (UAV) to dissipate heat generated by electronic modules in the UAV, such as an inertial measurement unit (IMU) module, an orthogonal frequency-division multiplexing (OFDM) module, and a control module of a main control system in the UAV.

The heat dissipation device may comprise an air guiding cover and a heat conduction plate. The air guiding cover forms an air duct which has an air inlet and an air outlet. The heat conduction plate constitutes a part of the air duct. When the UAV has two different electronic modules, one of the two different electronic modules is received within the air duct and the heat generated by the one is taken away directly by an airflow within the air duct. Another one of the two different electronic modules is located outside the air duct and connected with the heat conduction plate, and the heat generated by the another one is conducted onto the heat conduction plate, then taken away by the airflow within the air duct.

In some embodiments, an opening size of the air inlet is greater than that of the air outlet, such that an airflow velocity at the air inlet is smaller than that at the air outlet.

In some embodiments, the size of the cross-section of the air duct is not uniform. In some embodiments, the airflow at a place where the cross-section has a greater size is slower, increasing the duration of heat exchange with the airflow. The airflow at the place where the cross-section has a smaller size is faster, decreasing the duration of heat exchange with the airflow.

For example, a midstream guiding face is formed at a middle section of a sidewall of the air duct that is opposite to a mounting window. An upstream guiding face is formed at a position, which is close to the air inlet, of the sidewall of the air duct that is opposite to the mounting window, to change the cross-sectional size of the air duct.

In some embodiments, a flow guiding plate is provided within the air duct of the air guiding cover to change a flowing direction of the airflow within the air duct.

In some embodiments, a flow guiding face of the flow guiding plate may be disposed in a variety of ways. For example, the flow guiding face is disposed in a direction perpendicular to a sidewall of the air duct that is provided with the mounting window. In some other embodiments, the flow guiding face is provided opposite to the sidewall of the air duct that is provided with the mounting window.

In some embodiments, the flow guiding face of the flow guiding plate may be in a variety of shapes. The flow guiding face may be a concave arc face, a convex arc face, or a plane.

In some embodiments, the shape of the heat conduction plate may be planar or curved.

In some embodiments, the heat conduction plate may be a separate plate body component or one of side plates of an electrical box.

In some embodiments, the heat conduction plate is disposed in thermal insulation with an electronic module mounted within the air duct. For example, the heat conduction plate is spaced apart from the electronic module mounted within the air duct. In some embodiments, a thermal insulation material is provided between the heat conduction plate and the electronic module mounted within the air duct.

In some embodiments, the heat dissipation device may further comprise a mounting support for fixing the electronic module. The mounting support is erected within the air duct of the air guiding cover.

The mounting support may be fixed on a sidewall of the air duct of the air guiding cover or on the heat conduction plate.

In some embodiments, the heat dissipation device further comprises a fan for generating the airflow to dissipate heat.

The fan may be directly in communication with the air duct. For example, the fan is directly mounted at the air inlet of the air duct. The fan may be indirectly in communication with the air duct. For example, the fan is disposed at another portion of the UAV, and in communication with the air duct of the air guiding cover via a flow guiding channel inside the UAV.

Some embodiments of the present disclosure will be described in detail below in conjunction with the drawings.

Figure 2:
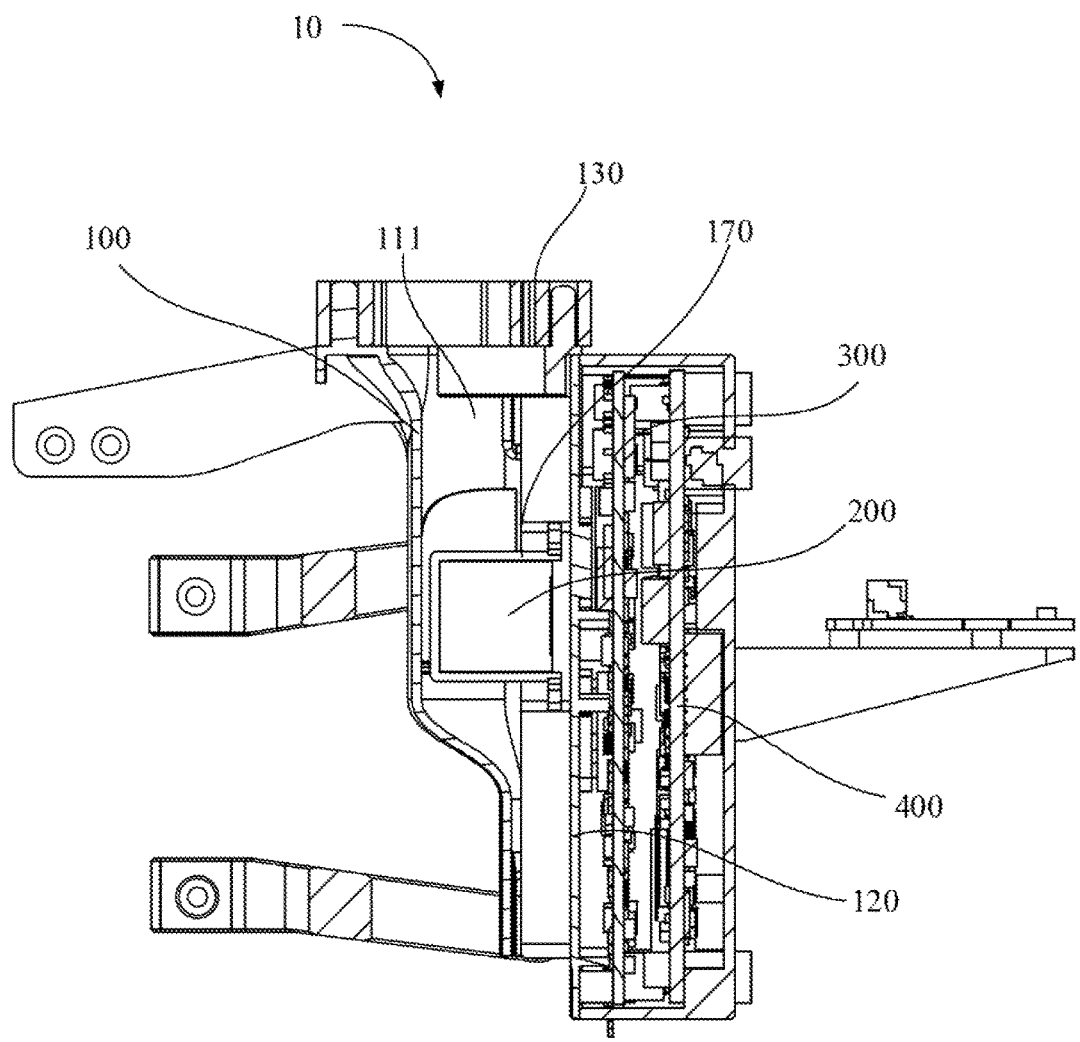
FIG. 2 is a cross sectional view of the UAV as shown in FIG. 1.

Referring to FIG. 1 and FIG. 2, a UAV 10 according to an embodiment of the present disclosure may comprise a heat dissipation device 100, a first electronic module 200, and a second electronic module 300.

The heat dissipation device 100 may comprise an air guiding cover 110 and a heat conduction plate 120 which is fixedly connected with the air guiding cover 110. The air guiding cover 110 and the heat conduction plate 120 may isolate the first electronic module 200 from the second electronic module 300 and meanwhile dissipate the heat generated by the first electronic module 200 and the second electronic module 300. For example, in the illustrated embodiment, the first electronic module 200 is received within the air guiding cover 110 and disposed spaced apart from the heat conduction plate 120. The second electronic module 300 is disposed on an outer surface of the heat conduction plate 120. The outer surface of the heat conduction plate 120 faces away from the air guiding cover 110. The heat generated by the second electronic module 300 may be conducted to the heat conduction plate 120, while the heat in the heat conduction plate 120 and the heat generated by the first electronic module 200 can be taken away by an airflow circulating within the air guiding cover 110.

Figure 3:
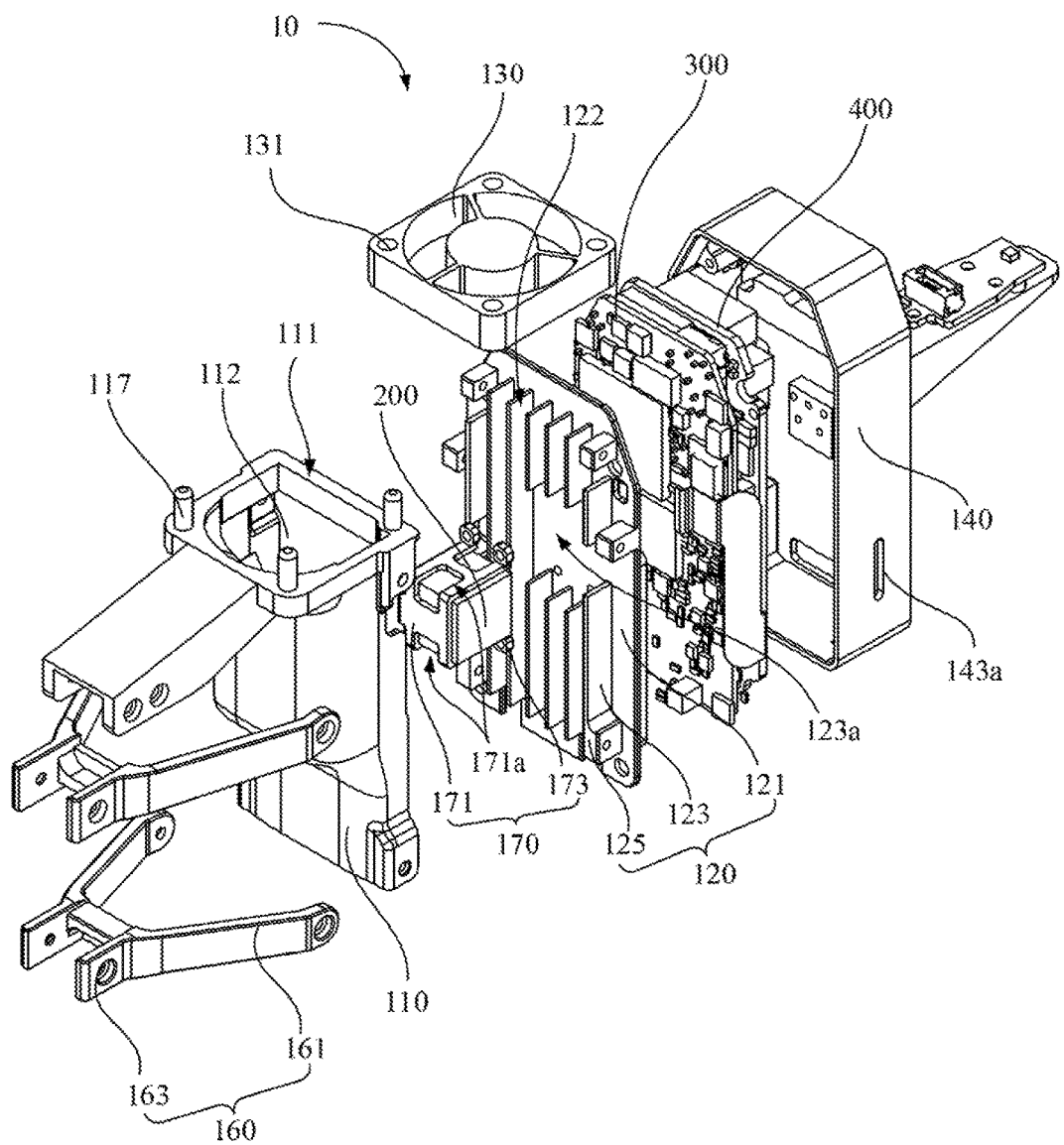
FIG. 3 is an exploded view of the UAV as shown in FIG. 1.
Figure 4:
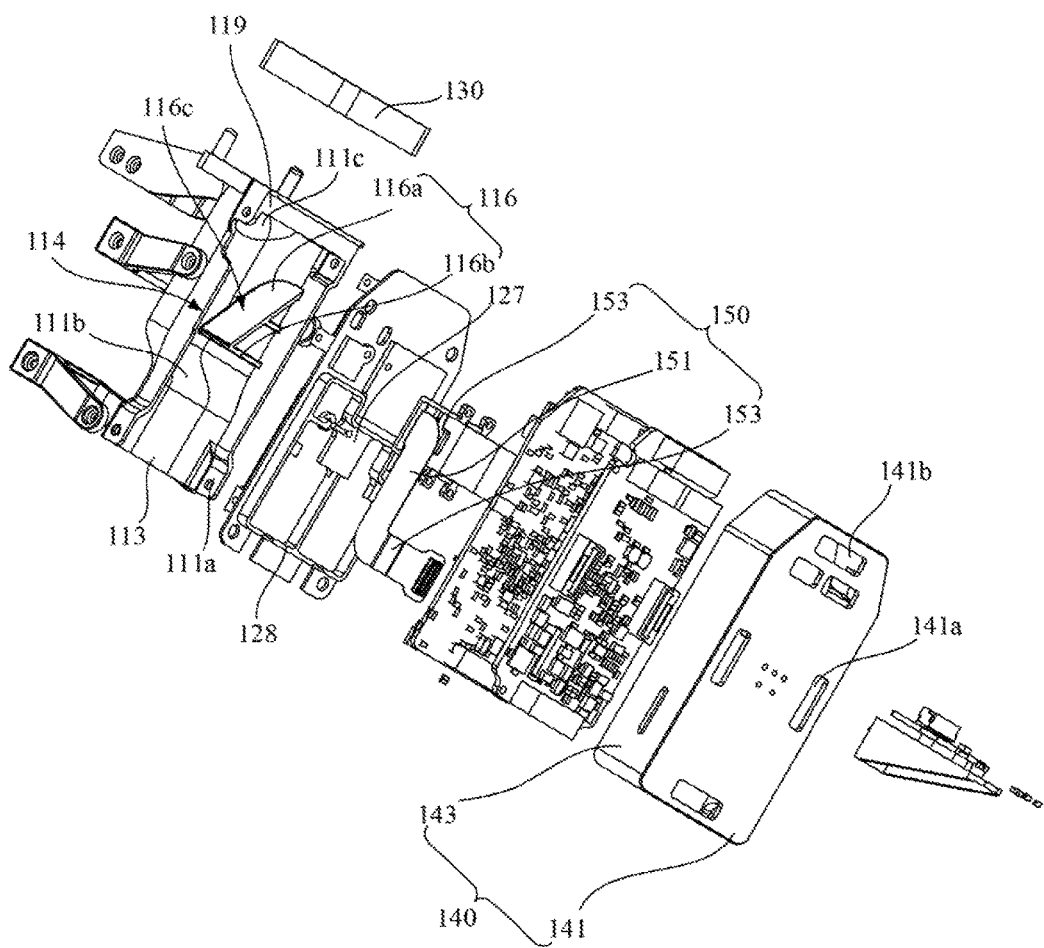
FIG. 4 is an exploded view of the UAV as shown in FIG. 1 at another angle of view.

Referring to FIG. 3 and FIG. 4, the air guiding cover 110 may comprise an air duct 111 for guiding the airflow, and an air inlet 112 and an air outlet 113 formed at two ends of the air duct 111, respectively. A mounting window 114 may be provided on and through a sidewall of the air duct 111.

An opening size of the air inlet 112 and an opening size of the air outlet 113 may not be equal to each other. In the illustrated embodiment, the opening size of the air inlet 112 is greater than the opening size of the air outlet 113.

The positions of the air inlet 112 and the air outlet 113 may be designed according to different requirements. For example, in the illustrated embodiment, the air inlet 112 may be disposed opposite to the air outlet 113 to decrease a resistance endured by the airflow passing through the air duct 111, further improving a heat dissipation efficiency of the heat dissipation device 100.

The heat conduction plate 120 may be used for fixing the second electronic module 300. The heat conduction plate 120 may be disposed at the mounting window 114 of the air guiding cover 110 and cover the mounting window 114 of the air guiding cover 110. In the illustrated embodiment, the air duct 111 has a plane-shaped mounting sidewall 119 on which the mounting window 114 is provided. The heat conduction plate 120 may comprise a plane-shaped plate body 121 which seals the mounting window 114.

Further, the mounting window 114 of the air guiding cover 110 may extend from an end of the air guiding cover 110 where the air inlet 112 is formed to an end of the air guiding cover 110 where the air outlet 113 is formed, and extend all the way through the air outlet 113. The plate body 121 may extend to the air outlet 113 and form the air outlet 113 jointly with sidewalls of the air duct 111. Since the heat conduction plate 120 occupies a great proportion of the mounting sidewall 119 of the air guiding cover 110, the contact area of the heat conduction plate 120, with which the air can contact, is increased, further improving the heat dissipation efficiency of the heat dissipation device 100.

Further, a midstream guiding face 111b may be formed on a middle section of the sidewall of the air duct 111 that is opposite to the mounting window 114. The midstream guiding face 111b may be an inclined plane provided on a sidewall of the air duct 111 to enable the air flowing towards the air outlet 113 to gradually converge. For example, in the illustrated embodiment, the first electronic module 200 is located at a position in an upstream of the midstream guiding face 111*b*, such that the air, after absorbing the heat generated by the first electronic module 200, flows towards the air outlet 113 as quickly as possible, to avoid the heat carried by the airflow from being dissipated reversely to the first electronic module 200. This further preventing the heat generated by one of the first electronic module 200 and the second electronic module 300 from influencing the other one of the first electronic module 200 and the second electronic module 300.

The midstream guiding face 111*b* may be designed according to a different requirement to have a shape different from that shown in the figures and described above. For example, the midstream guiding face 111*b* may be a convex curved face provided on the sidewall of the air duct 111.

Further, an upstream guiding face 111*c* which is close to the air inlet 112 may be formed on a sidewall of the air duct 111 that is opposite to the mounting window 114. In the illustrated embodiment, the upstream guiding face 111*c* is an inclined curved face provided on the sidewall of the air duct 111, to enable the air flowing towards the middle section of the air duct 111 from the air inlet 112 to gradually converge. For example, in the illustrated embodiment, the first electronic module 200 is located at a position which is downstream of the upstream guiding face 111*c*. This increases the speed of the air flowing towards the first electronic module 200, thereby further improving the heat dissipation efficiency for the first electronic module 200.

The upstream guiding face 111*c* may be designed according to a different requirement to have a shape different from that shown in the figures and described above. For example, the upstream guiding face 111*c* can be a convex curved face provided on the sidewall of the air duct 111.

Further, the heat conduction plate 120 may also comprise a plurality of heat dissipation fins 123 disposed on a surface of the plate body 121 that faces the air duct 111 to increase the contact area of the air within the air duct 111 of the air guiding cover 110 with the heat conduction plate 120, thereby improving the heat dissipation efficiency of the heat conduction plate 120.

In some embodiments, as shown in the figures, the plurality of heat dissipation fins 123 are provided with a hollow region 123*a* for mounting the first electronic module 200.

The extending directions of the plurality of heat dissipation fins 123 may be designed according to different requirements. For example, in the illustrated embodiment, the plurality of heat dissipation fins 123 are disposed in parallel and spaced apart to form a plurality of flow guiding grooves 122 which are disposed along an extending direction parallel to the air duct 111. Disposing the flow guiding grooves 122 along the extending direction parallel to the air duct 111 reduces the resistance on the airflow within the air duct 111 passing through the plurality of heat dissipation fins 123, thereby further improving the heat dissipation efficiency of the heat conduction plate 120.

The heat conduction plate 120 may be detachably connected with the air guiding cover 110. The connecting manner of the heat conduction plate 120 and the air guiding cover 110 may be designed according to different requirements. For example, the heat conduction plate 120 and the air guiding cover 110 can be fixedly connected together via a snap structure or a threaded fastener.

In the illustrated embodiment, a plurality of fixing bosses 125 are provided on the surface of the plate body 121 that is close to, i.e., that faces, the air duct 111 of the air guiding cover 110. In some embodiments, at least some of the plurality of fixing bosses 125 are fixedly connected with the heat dissipation fins 123. In some embodiments, at least some of the plurality of fixing bosses 125 are formed integrally with the heat dissipation fins 123. The plurality of fixing bosses 125 are fixedly connected with the sidewall of the air duct 111 of the air guiding cover 110 to fix the heat conduction plate 120 on the air guiding cover 110.

Further, sidewalls of the air duct 111 may protrude outwardly to form a plurality of positioning slots 111*a* with which the plurality of fixing bosses 125 are respectively matched. Forming the plurality of positioning slots 111*a* by the sidewalls protruding outwardly prevents the fixing bosses 125 from blocking the airflow within the air guiding cover 110. Further, the fixing bosses 125 cooperate with the positioning slots 111*a* for positioning.

Further, a mounting portion 127 for fixing the second electronic module 300 may be provided on the surface of the heat conduction plate 120 that faces away from the air duct 111 of the air guiding cover 110, to facilitate the mounting of the second electronic module 300. In the illustrated embodiment, the mounting portion 127 is a mounting boss provided on the surface of the heat conduction plate 120 that faces away from the air duct 111.

Further, a blocking border 128 may also be provided on the surface of the heat conduction plate 120 that faces away from the air duct 111. The region enclosed by the blocking border 128 forms an avoidance portion within which an electronic device of the second electronic module 300 may be received.

Further, the air guiding cover 110 may also comprise a flow guiding plate 116 disposed within the air duct 111. A flow guiding face 116*c* of the flow guiding plate 116 is disposed aslope relative to the extending direction of the air duct 111, to form a flow converging portion with a gradually narrowing width at the middle section of the air duct 111. An end of the flow converging portion with a greater width is disposed to face the air inlet 112.

For example, in the illustrated embodiment, the flow guiding plate 116 is located at a side of the first electronic module 200, which causes the air within the air duct 111 of the air guiding cover 110 to flow towards the first electronic module 200 through the flow guiding plate 116, which further improves the heat dissipation efficiency for the first electronic module 200.

The specific structure of the flow guiding plate 116 may be designed according to different requirements. For example, in the illustrated embodiment, the flow guiding plate 116 comprises a main plate body 116*a* and a connecting plate 116*b* disposed at a back side of the main plate body 116*a*. The connecting plate 116*b* is fixedly connected with a sidewall of the air duct 111 to fix the flow guiding plate 116 within the air duct 111. A front side of the main plate body 116*a* forms the flow guiding face 116*c*.

In some other embodiments, the flow guiding plate 116 further comprises a hook located on an edge of the main plate body 116*a*. The sidewall of the air duct 111 is provided with a snap groove which corresponds to the hook. The hook can be snapped with the snap groove to fix the main plate body 116*a* within the air duct 111. The front side of the main plate body 116*a* forms the flow guiding face 116*c*.

Further, the shape of the flow guiding face 116*c* may be designed according to different requirements. For example, the flow guiding face 116*c* may be a concave arc face, a convex arc face or a plane.

Further, the flow guiding face 116*c* may disposed according to different requirements. For example, in the illustrated embodiment, the flow guiding face 116c is disposed perpendicular to the sidewall of the air duct 111 that is provided with the mounting window 114.

In some other embodiments, the flow guiding face 116c is disposed facing the sidewall of the air duct 111 that is provided with the mounting window 114.

In some embodiments, as shown in the figures, the heat dissipation device 110 further includes a fan 130. The airflow from the fan 130 may enter the air duct 111 via the air inlet 112.

Arrangement of the fan 130 may be designed according to different requirements. For example, in the illustrated embodiment, the fan 130 is mounted at the air inlet 112 of the air guiding cover 110, and a wind-out side of the fan 130 is disposed towards the air duct 11 of the air guiding cover 110, such that the fan 130 is directly in communication with the air inlet 112.

In some other embodiments, the fan 130 is in communication with the air inlet 112 via a flow guiding channel. For example, the fan 130 can be disposed at another part of the UAV 10, and in communication with the air duct ill of the air guiding cover 110 via the flow guiding channel inside the UAV 10. In some embodiments, the fan 130 is disposed at a position on the UAV 10 that is far away from the air guiding cover 110. A portion of the airflow generated by the fan 130 is guided to the air guiding cover 110 via the flow guiding channel inside the UAV 10, and another portion of the airflow is guided to a power supply of the UAV 10 to dissipate the heat generated by the power supply.

The fan 130 may be mounted in different manners according to different requirements. For example, in the illustrated embodiment, an opening end side of the air inlet 112 is provided with a plurality of positioning posts 117. Correspondingly, an edge of the fan 130 is provided with a plurality of positioning holes 131. The plurality of positioning posts 117 can be inserted through the plurality of locating holes 131, respectively, to position the fan 130 on the opening end side of the air inlet 112.

In some other embodiments, the heat dissipation device 100 further comprises a fan support through which the fan 130 is fixed on the opening end side of the air inlet 112.

Further, the heat dissipation device 100 may also comprise a mounting housing 140 disposed at a side of the heat conduction plate 120 that faces away from the air duct 111I of the air guiding cover 110. The mounting housing 140 and the heat conduction plate 120 jointly form an electrical box for receiving the second electronic module 300.

In the illustrated embodiment, the mounting housing 140 comprises a bottom plate 141 and a plurality of side plates 143. The plurality of side plates 143 are connected in sequence to enclose a loop-like closed structure and are connected with edges of the bottom plate 141. The bottom plate 141 is disposed opposite to the heat conduction plate 120. The edges of the plurality of side plates 143 that are distal from the bottom plate 141 form an opening having a shape matching the shape of an outline of the heat conduction plate 120.

Further, a connecting window 141a for receiving an external plug and/or a heat dissipation window 141b for exposing an electronic component may be disposed on the bottom plate 141.

The manner for connecting the mounting housing 140 with the heat conduction plate 120 may be designed according to different requirements. For example, in the illustrated embodiment, the heat dissipation device 100 further comprises a connecting support 150 which fixedly connects the heat conduction plate 120 with the mounting housing 140.

The specific structure of the connecting support 150 may be designed according to different requirements. For example, in the illustrated embodiment, the connecting support 150 has a Z-shaped structure and comprises a connecting body 151 and two fixing portions 153 which are disposed at two ends of the connecting body 151, respectively. The two fixing portions 153 are fixedly connected with the heat conduction plate 120 and the mounting housing 140, respectively.

Further, the connecting body 151 may have a sheet-shaped structure. The two fixing portions 153 are folded sheets which are bent and extend from the two ends of the connecting body 151, respectively. One of the sidewalls 143 of the mounting housing 140 may be provided with a snap hole 143a (as shown in FIG. 3). One of the fixing portions 153 is inserted in the snap hole 143a, and the other one of the fixing portions 153 is disposed clingingly at the surface of the heat conduction plate 120 that is close to the air duct 111 of the air guiding cover 110.

Further, the heat dissipation device 100 may also comprise a fixing support 160 for fixing the air guiding cover 110. For example, the heat dissipation device 100 may be fixed to the body of the UAV 10 via the fixing support 160.

The fixing support 160 may be mounted in different manners according to different requirements. For example, in the illustrated embodiment, there are two fixing supports 160, one of which is fixedly connected with the air guiding cover 110, and the other one of is fixedly connected with the heat conduction plate 120.

The specific structure of the fixing support 160 may be designed according to different requirements. For example, in the illustrated embodiment, the fixing support 160 comprises a U-shaped body 161 and two connecting lugs 163. The U-shaped body 161 may comprise a bottom and two arms which extend from two ends of the bottom, respectively, towards the same side of the bottom. The two connecting lugs 163 are disposed opposite to and spaced apart from each other, and on an outer side of the bottom of the U-shaped body 161 that is opposite to the side on which the arms of the U-shaped body 161 are disposed. Further, the connecting lugs 163 extend in a direction perpendicular to the bottom of the U-shaped body 161 and facing away from the arms of the U-shaped body 161.

In the illustrated embodiment, the first electronic module 200 is received within the air duct 111 of the air guiding cover 110, and disposed spaced away from the heat conduction plate 120. The second electronic module 300 is disposed on a surface of the heat conduction plate 120 that faces away from the air duct 111 of the air guiding cover 110. The heat generated by the second electronic module 300 is conducted onto the heat conduction plate 120. The heat generated by the heat conduction plate 120 and the first electronic module 200 is taken away by the airflow circulating within the air duct 110.

The heat generated by the first electronic module 200 may be more than or less than the heat generated by the second electronic module 300. In the illustrated embodiment, the first electronic module 200 is an IMU module, and the second electronic module 300 is an OFDM module. The heat generated by the IMU module is generally less than the heat generated by the OFDM. The IMU module is separated from the electrical box by the air guiding cover 110 and the heat conduction plate 120, and the heat generated by the IMU module can be dissipated separately.

Further, the heat dissipation device 100 may also comprise a mounting support 170 for fixing the first electronic module 200. The mounting support 170 is located within the air duct 111 of the air guiding cover 110. Specifically, the mounting support 170 spaces the first electronic module 200 apart from the heat conduction plate 120, to prevent the heat in the heat conduction plate 120 from passing directly onto the first electronic module 200.

The mounting support 170 may be connected in different manners according to different requirements. For example, in the illustrated embodiment, the mounting support 170 is fixedly connected with the surface of the heat conduction plate 120 that is close to the air duct 111, such that the first electronic module 200 may be detached together with the heat conduction plate 120, to facilitate the repair the first electronic module 200.

In some other embodiments, the mounting support 170 is fixedly connected with a sidewall of the air duct 111.

Further, in order to avoid the heat in the heat conduction plate 120 from being dissipated via the mounting support 170, the mounting support 170 is a thermal insulation support and detachably connected with the heat conduction plate 120.

The specific structure of the mounting support 170 may be designed according to different requirements. For example, in the illustrated embodiment, the mounting support 170 comprises a U-shaped plate body 171 and fixing lugs 173 bending from two ends of the U-shaped plate body 171, respectively. The fixing lugs 173 extend in opposite directions. The U-shaped plate body 171 is provided with hollow portions 171a for dissipating heat. A clamping space is formed in the U-shaped plate body 171. That is, the first electronic module 200 is clamped within the U-shaped plate body 171. The fixing lugs 173 are fixedly connected with the surface of the heat conduction plate 120 that is close to the air duct 111.

In some other embodiments, the mounting support 170 comprises a plurality of L-shaped frames. One end of each L-shaped frame is fixed on the surface of the heat conduction plate 120 that is close to the air duct 111. Another end of each L-shaped frame is disposed in parallel to and spaced away from the heat conduction plate 120, and abuts against the first electronic module 200. A clamping space is formed between the two L-shaped frames which are disposed opposite to each other. That is, the first electronic module 200 is clamped between the two L-shaped frames which are disposed opposite to each other.

Further, the UAV 10 may also comprise a third electronic module 400 which is disposed at a side of the second electronic module 300 that faces away from the heat conduction plate 120. In the illustrated embodiment, the third electronic module 400 is a control module.

When the above-described heat dissipation device 100 starts to work, the first electronic module 200 is isolated from the second electronic module 300 by the heat conduction plate 120. The first electronic module 200 is fixed within the air duct 111 of the air guiding cover 110, the second electronic module 300 is located outside the air duct 111 of the air guiding cover 110 and fixed on a surface of the heat conduction plate 120 that faces away from the air duct 111. The airflow generated by the fan 130 may blow downward from the top of the first electronic module 200, be converged to the surface of the first electronic module 200 by the air duct 111 of the air guiding cover 110, and flow away through a space between the heat dissipation fins 123 of the heat conduction plate 120, to take away the heat on the surface of the first electronic module 200 and the heat dissipated from the second electronic module 300 to the beat conduction plate 120, so as to reduce the temperature.

As compared with a traditional UAV, the above-described UAV 10 has at least the following advantages:

(1) The above described UAV 10 employs the heat dissipation device 100 to dissipate the heat generated by a plurality of electronic modules separately, thereby preventing the heat generated by one electronic module from influencing another electronic module, such that the plurality of electronic modules can operate in different environmental temperatures. Further, the heat generated by various electronic modules can be taken away quickly via the airflow circulating within the air duct 111 of the air guiding cover 110.

For example, the IMU module is disposed within the air duct 111 of the air guiding cover 110. The heat generated by the IMU module can be taken away directly by the airflow within the air duct 111 of the air guiding cover 110. The OFDM module is located outside the air guiding cover 110 and fixed on the heat conduction plate 120. The heat generated by the OFDM module is conducted to the heat conduction plate 120 and taken away by the airflow within the air duct 111 of the air guiding cover 110.

(2) The heat conduction plate 120 of the above-described heat dissipation device 100 directly constitutes a portion of the sidewalls of the air duct 111 of the air guiding cover 100, such that the heat generated by the second electronic module 300 can be dissipated directly via the heat conduction plate 120, thereby improving the heat dissipation efficiency for the second electronic module 300.

(3) The second electronic module 300 of the above-described UAV 10 is fixed directly on the heat conduction plate 120, which is fixed on the air guiding cover 110. This allows the second electronic module 300 to be more firmly fixed in the UAV 10, thus avoiding bad electrical contact in the second electronic module 300 when the UAV 10 flies and vibrates. Further, the strength of the whole structure of the UAV 10 is enhanced, meeting the requirement of the strength on the structure of the UAV 10.

The foregoing description is merely illustrative of the embodiments of the disclosure, and is not intended to limit the scope of the disclosure. Any equivalent structural or flow variations made on the basis of the description and the drawings of the disclosure, and their direct or indirect application to other relevant technical fields, shall all fall into the scope of the disclosure.

What is claimed is:

1. A heat dissipation device, comprising:
   an air guiding cover comprising:
   an air duct configured to guide an airflow and including a mounting window formed on a sidewall of the air duct;
   an air inlet formed at a first end of the air duct;
   an air outlet formed at a second end of the air duct; and
   a flow guiding plate disposed within the air duct, a flow guiding face of the flow guiding plate being substantially perpendicular to the sidewall on which the mounting window is formed and being disposed aslope relative to an extending direction of the air duct to form a flow converging portion with a gradually narrowing width at a middle section of the air duct, and an end of the flow converging portion with a larger width being disposed towards the air inlet; and
   a heat conduction plate disposed at the mounting window and covering the mounting window.

2. The heat dissipation device of claim 1, wherein an opening size of the air inlet is greater than an opening size of the air outlet.

3. The heat dissipation device of claim 1, wherein:
the sidewall comprises a plane-shaped mounting sidewall on which the mounting window is formed, and
the heat conduction plate comprises a plane-shaped plate body covering the mounting window.

4. The heat dissipation device of claim 3, wherein:
the mounting window extends from the first end of the air duct to the second end of the air duct, and extends all the way through the air outlet, and
the plate body extends to the air outlet and forms the air outlet jointly with other sidewalls of the air duct.

5. The heat dissipation device of claim 1, further comprising:
a midstream guiding face formed at a middle section of another sidewall of the air duct and configured to converge the airflow towards the air outlet, the another sidewall being opposite to the sidewall on which the mounting window is formed.

6. The heat dissipation device of claim 5, wherein the midstream guiding face includes a convex curved face or an inclined plane.

7. The heat dissipation device of claim 1, further comprising:
an upstream guiding face formed on another sidewall of the air duct at a location close to the air inlet and configured to converge an airflow from the air inlet towards a middle section of the air duct, the other sidewall being opposite to the sidewall on which the mounting window is formed.

8. The heat dissipation device of claim 7, wherein the upstream guiding face includes a convex curved face or an inclined plane.

9. The heat dissipation device of claim 1, wherein the heat conduction plate comprises a plate body sealing the mounting window, and a plurality of heat dissipation fins disposed on a surface of the plate body that faces the air duct.

10. The heat dissipation device of claim 9, wherein a hollow region is formed among the plurality of heat dissipation fins.

11. The heat dissipation device of claim 9, wherein the plurality of heat dissipation fins are disposed substantially in parallel and spaced apart from each other to form a plurality of flow guiding grooves which are disposed along an extending direction parallel to the air duct.

12. The heat dissipation device of claim 1, wherein the heat conduction plate includes a mounting portion for fixing an electronic module and provided on a surface of the heat conduction plate that faces away from the air duct.

13. The heat dissipation device of claim 1, wherein the flow guiding plate comprises a main plate body and a connecting plate disposed at a back side of the main plate body, the connecting plate being fixedly connected with another sidewall of the air duct to fix the flow guiding plate within the air duct, and the flow guiding face including a front side of the main plate body.

14. The heat dissipation device of claim 1, wherein:
the flow guiding plate comprises a main plate body and a hook located on an edge of the main plate body, the flow guiding face including a front side of the main plate body,
the air duct comprises a snap structure on another sidewall of the air duct, and
the hook is snapped with the snap groove to fix the main plate body within the air duct.

15. An unmanned aerial vehicle (UAV), comprising:
the heat dissipation device of claim 1;
a first electronic module arranged in the heat dissipation device; and
a second electronic module arranged in the heat dissipation device and separated from the heat dissipation device.

16. The UAV of claim 15, wherein the first electronic module generates more heat than the second electronic module when the UAV operates.

17. The UAV of claim 15, further comprising:
a third electronic module disposed at a side of the second electronic module that faces away from the heat conduction plate.

18. The UAV of claim 17, wherein:
the first electronic module includes an inertial measurement unit module, the second electronic module includes an orthogonal frequency-division multiplexing module, and the third electronic module includes a control module, and
the first, second, and third electronic modules form a main control module of the UAV.

19. The UAV of claim 15, wherein the first electronic module includes an inertial measurement unit module and the second electronic module includes an orthogonal frequency-division multiplexing module.

* * * * *